United States Patent [19]

Sakamoto

[11] Patent Number: 5,714,790
[45] Date of Patent: Feb. 3, 1998

[54] SEMICONDUCTOR DEVICE WITH AN INDIUM-TIN-OXIDE IN CONTACT WITH A SEMICONDUCTOR OR METAL

[75] Inventor: Masaru Sakamoto, Atsugi, Japan

[73] Assignee: Canon Kabushiki Kaisha, Tokyo, Japan

[21] Appl. No.: 635,213

[22] Filed: Apr. 17, 1996

Related U.S. Application Data

[63] Continuation of Ser. No. 366,428, Dec. 30, 1994, abandoned, which is a continuation of Ser. No. 22,521, Feb. 25, 1993, abandoned.

[30] Foreign Application Priority Data

Feb. 28, 1992 [JP] Japan ..................... 4-075879
Dec. 28, 1992 [JP] Japan ..................... 4-358559

[51] Int. Cl.$^6$ ............................ H01L 29/04; H01L 31/062
[52] U.S. Cl. ..................... 257/440; 257/52; 257/59; 257/72; 257/291; 437/40; 437/41
[58] Field of Search ..................... 257/440, 59, 72, 257/291, 52; 437/40, 41

[56] References Cited

U.S. PATENT DOCUMENTS 4,990,460  2/1991  Moriyama ..................... 437/40
5,341,012  8/1994  Misawa et al. ..................... 257/72

FOREIGN PATENT DOCUMENTS 57-76525   10/1980  Japan.
WO8903593  4/1989   WIPO ..................... H01L 31/02

OTHER PUBLICATIONS

S.M. Sze, "Physics of Semiconductor Devices" John Wiley & Sons, 1988, New York, p. 819.

M. Sasuga et al. "10.4 in. Diagonal Multicolor Display Using Amorphous Silicon TF7-LCD", Vapor Display, 1989 pp. 510–512.

Conference Record of the 1988 International Display Research Conference, Oct. 4, 1988, pp. 155–158, Takeda et al., "An Amorphous Si TFT Array With TaOx/SiNx Double Layered Insulator For Liquid Crystals Displays."

IEEE Electron Device Letters, vol. 12, No. 8, Aug. 1991, pp. 413–415, Kakinuma et al., "Direct-Contact Type Images Sensors Using Novel Amorphous-Silicon Photodiode Array."

Applied Optics, vol. 18, No. 10, May 15, 1979, pp. 1488–1489, Hass et al., "Transparent Electrically Conducting Thin Films For Spacecraft Temperature Control Applications."

Patent Abstracts of Japan, vol. 10, No. 278, p. 499, Sep. 20, 1986, & JP-A-61 099 121, May 17, 1986.

Patent Abstracts of Japan, vol. 6, No. 159, p. 136, Aug. 20, 1982, & JP-A-57 076 525, May 13, 1982.

*Primary Examiner*—Valencia Martin Wallace
*Attorney, Agent, or Firm*—Fitzpatrick, Cella, Harper & Scinto

[57] ABSTRACT

A semiconductor device has an ITO film which is in contact with a semiconductor or a metal, the ITO film having an insulating film with SiN as the main constituent provided on or under at least a portion of the ITO film.

10 Claims, 11 Drawing Sheets

SEMICONDUCTOR DEVICE WITH AN INDIUM-TIN-OXIDE IN CONTACT WITH A SEMICONDUCTOR OR METAL

This application is a continuation of application Ser. No. 08/366,428, filed Dec. 30, 1994, now abandoned; which is a continuation of application Ser. No. 08/022,521, filed Feb. 25, 1993, now abandoned.

BACKGROUND OF THE INVENTION

1. Field of the Invention

The present invention relates to a semiconductor device having an Indium-Tin-Oxide (ITO) film which is in contact with a semiconductor or a metal.

2. Description of the Related Art

In liquid-crystal display devices, an insulating film has hitherto been provided between a pixel electrode and an oriented film with a view to preventing the liquid crystal from leaking (Japanese Patent Laid-Open No. 57-76525).

However, in a case where an ITO film is used as a pixel electrode in the above-described prior art, if an insulating film in contact with an ITO film is formed of a compound containing oxygen, such as $SiO_2$, the following problems may occur, for example, the semiconductor device may be thermally unstable, ohmic contact cannot be made, the resistance value of ITO increases, variations in characteristics occur, or delay time increases.

SUMMARY OF THE INVENTION

The present invention solves the above-mentioned problems of the prior art.

An object of the present invention is to provide a semiconductor device which can be operated at high speed with low power consumption, and to provide a liquid-crystal display device having high-image quality and a photoelectric converting device, both of which devices use the semiconductor device.

Another object of the present invention is to provide a semiconductor device having an ITO film in contact with a semiconductor or a metal, said ITO film having an insulating film with silicon nitride as the main constituent disposed on or under at least a portion of the ITO film.

Objectives and advantages, in addition to those discussed above, shall be apparent to those skilled in the art from the description of the preferred embodiment of the invention which follows. In the description, reference is made to the accompanying drawings, which form a part hereof, and which illustrate examples of the invention. Such examples, however, are not exhaustive of the various embodiments of the invention.

A semiconductor device in accordance with the present invention has an ITO film in contact with a semiconductor or a metal, said ITO film having an insulating film with silicon nitride as the main constituent provided on or under at least a portion of the ITO film.

DETAILED DESCRIPTION OF THE PREFERRED EMBODIMENTS

Preferred embodiments of a semiconductor device of the present invention will be explained below with reference to the accompanying drawings.

First Embodiment

Figure 1:
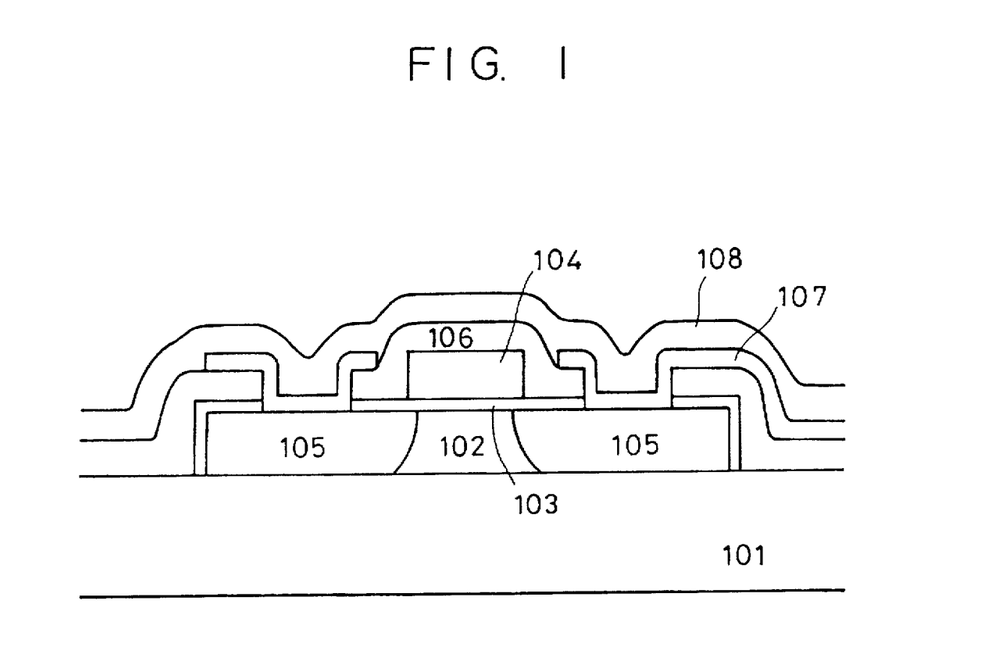
FIG. 1 is a sectional view of a liquid-crystal display device according to a first embodiment of the present invention.

FIG. 1 is a sectional view of a liquid-crystal display device in which a semiconductor device of the present invention is used. In FIG. 1, polysilicon thin film transistor (TFT) is formed on a glass substrate 101. An ITO film 107 is formed thereon with a first insulating film 106 provided in between, and a second insulating film 108 is formed on the ITO film 107. Reference numeral 102 denotes a channel area of a polysilicon TFT; reference numeral 103 denotes a gate oxide film thereof; reference numeral 104 denotes a gate electrode thereof; and reference numeral 105 denotes a source/drain area thereof.

Figure 10:
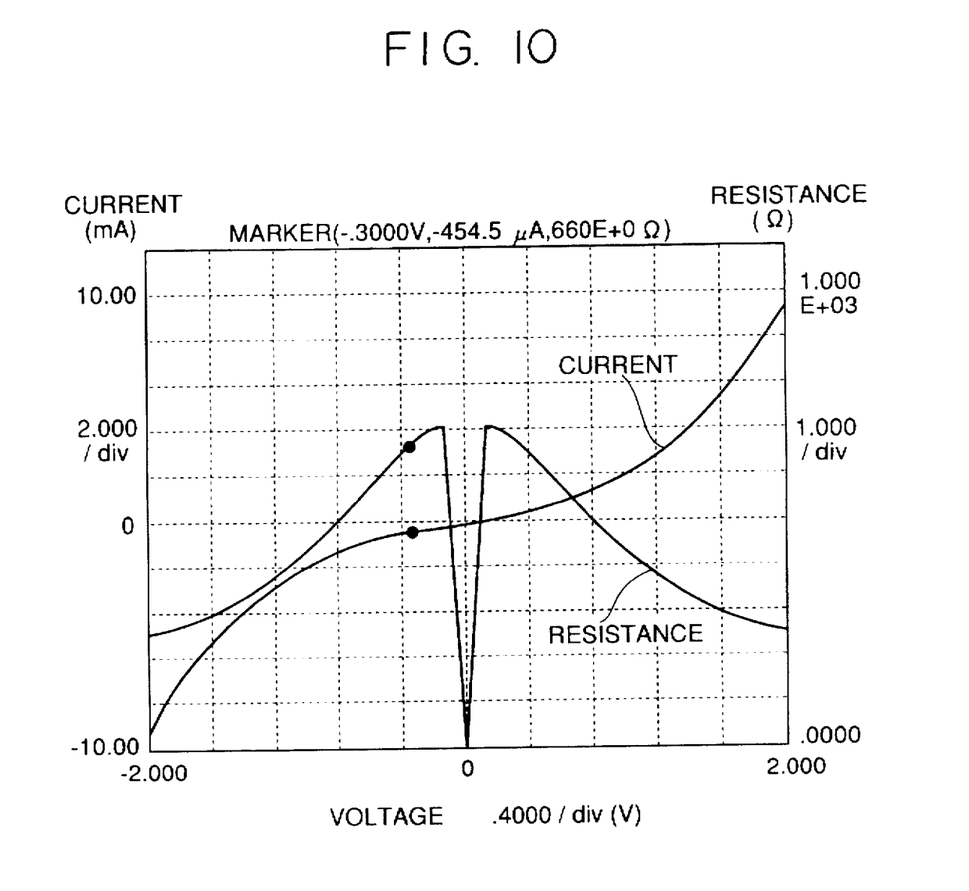
FIG. 10 is a graph showing $SiO_2$ type ITO/Si contact (directly-upper film dependence) of ITO sheet resistance.
Figure 11:
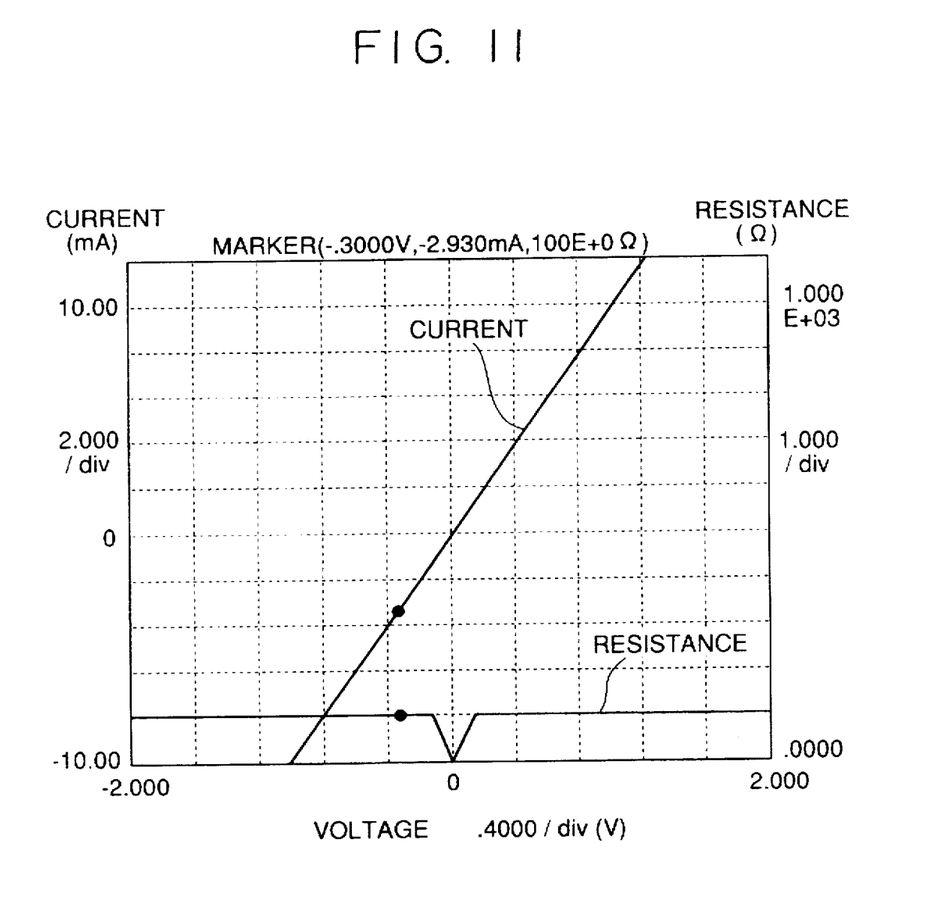
FIG. 11 is a graph showing silicon nitride type ITO/Si contact (directly-upper film dependence) of ITO sheet resistance.

In this embodiment, the first insulating film 106 and the second insulating film 108 are formed of $SiN_x$ films. The reason for this is to prevent the composition ratios of In—O and Sn—O of the ITO film 107 from varying because oxygen within the insulating film is diffused, thereby increasing the resistance value (FIG. 9), and to prevent the ohmic property of the insulating film from being lost because oxygen within the insulating film is diffused (FIGS. 10 and 11) since the film is present on an ITO/Si contact portion particularly in the second insulating film 108. Well-known techniques, such as sputtering, vapor deposition, spin coat method, chemical vapor deposition (CVD), roll dipping method, printing method, or application method, may be used for a method of forming $SiN_x$ films. $SiN_x$ means a film in which the stoichiometric composition of $Si_3N_4$ is varied. The thickness of a film with $SiN_x$ as the main constituent is preferably from 300 Å to 2 μm in the present invention. When the thickness is less than 300 Å, the insulation properties of the film cannot be ensured. When the thickness is greater than 2 μm, the stress of the film increases and the film becomes likely to peel. A more preferable range for the thickness of a film with $SiN_x$ as the main constituent is from 500 Å to 1.5 μm.

Figure 9:
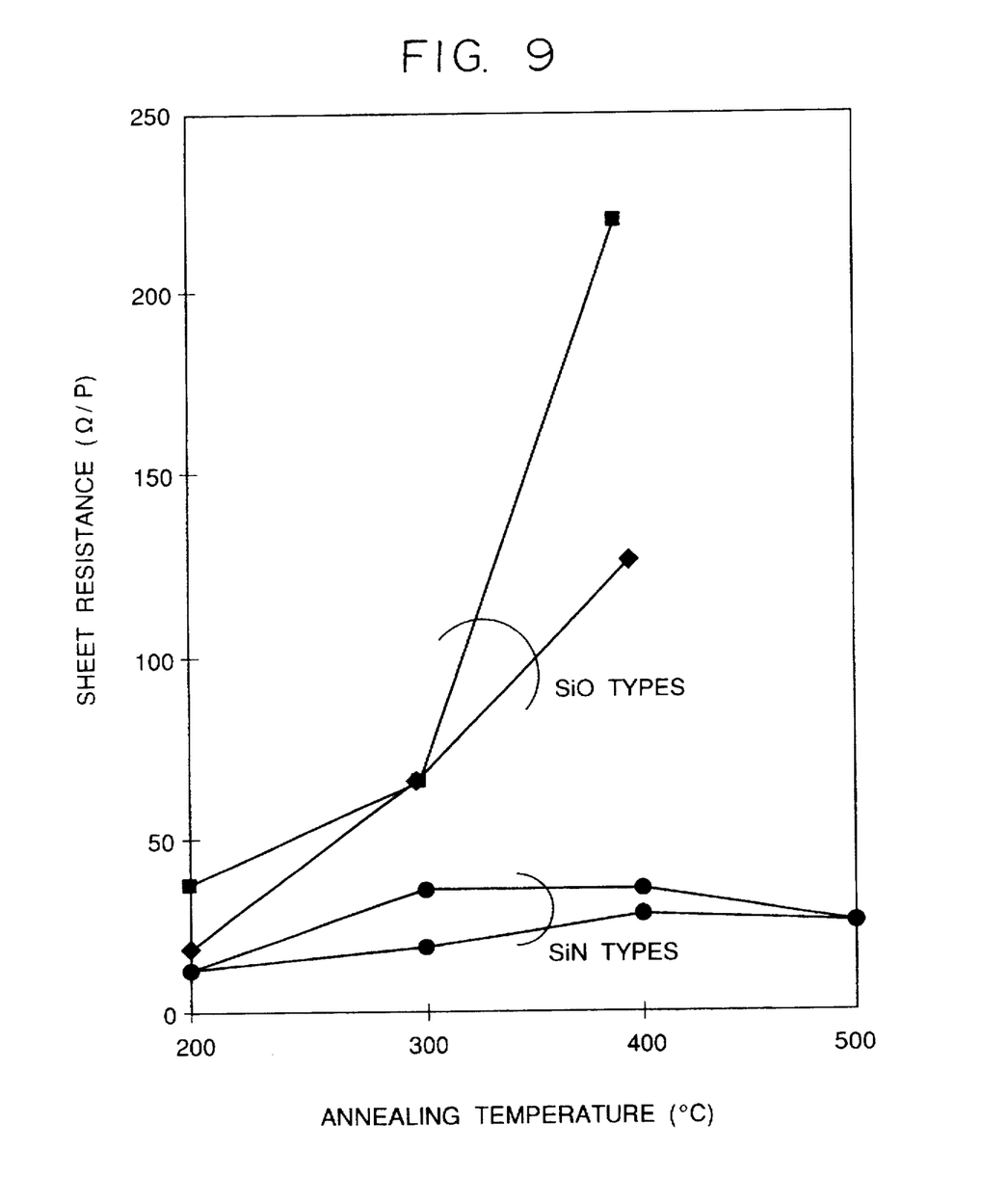
FIG. 9 is a graph showing the temperature characteristics (directly-upper film dependency) of ITO sheet resistance.

FIG. 9 shows changes in the resistance value of ITO when a sputtered insulating film was formed directly on ITO under the conditions of 4 KW and 4 mmTorr after a vacuum of $10^{-6}$ Torr had been reached.

When an $SiN_x$ film was formed by a CVD method, an increase in the resistance value of ITO was observed as $N_2$—O was mixed in place of $NH_3$ under the conditions of an RF of 380 KHz, a power supply of 3.0 A, 500 mm Torr of pressure, a temperature of 300° C., 140 cc/min of $SiH_4$, 600 cc/min of $NH_3$, and 600 cc/min of $N_2$ (carrier gas). In addition, when 300 cc/min of $O_2$ was used instead of $N_2$—O, the ohmic property shown in FIG. 11 was lost.

Second Embodiment

Figure 2:
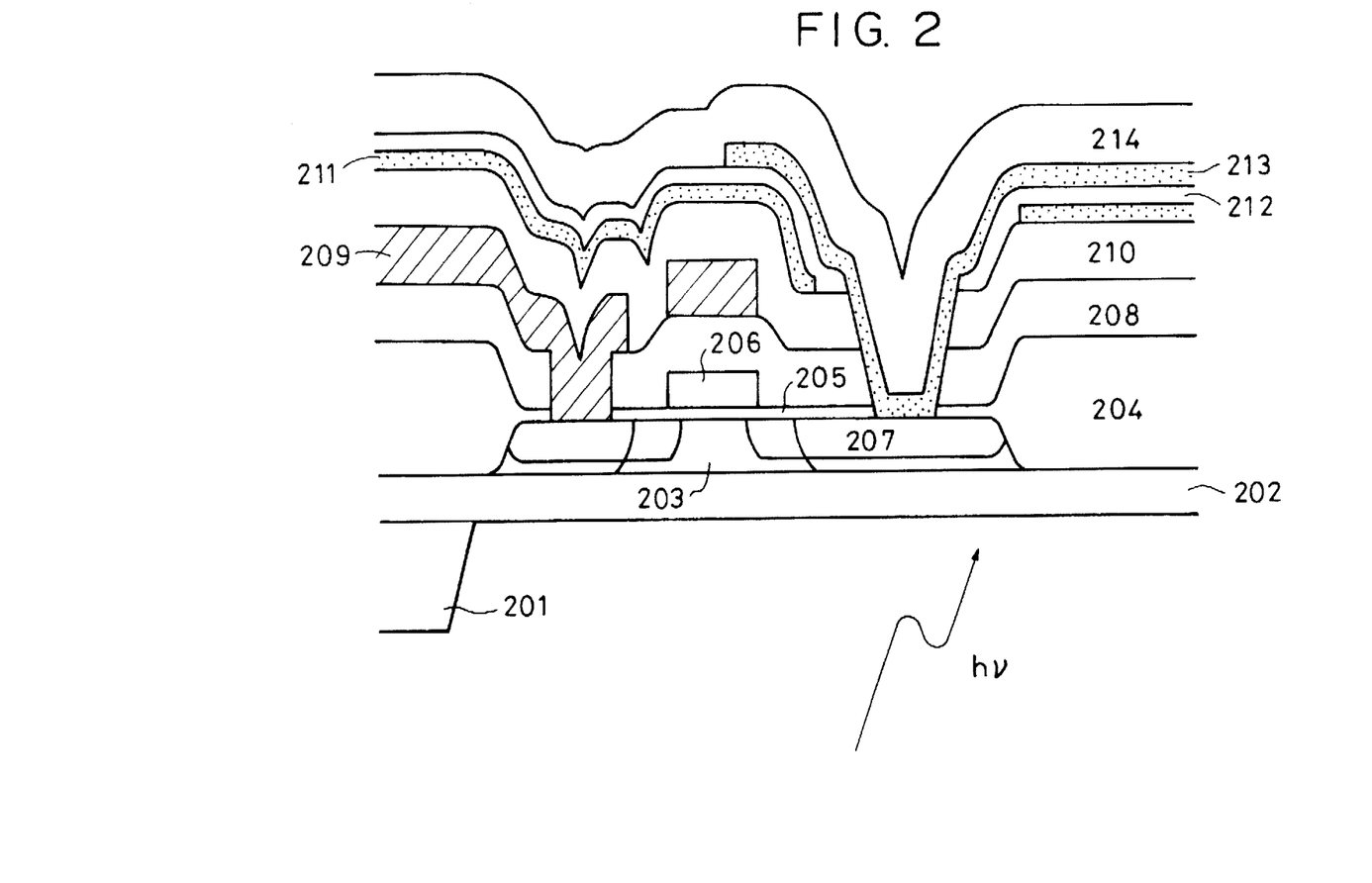
FIG. 2 is a sectional view of a liquid-crystal display device according to a second embodiment of the present invention.

FIG. 2 is a sectional view of a liquid-crystal display device in which a semiconductor device of this embodiment is used. In FIG. 2, TFT is formed on an Si substrate 201. A first insulating film 210, a second insulating film 212, and a third insulating film 214 are each formed of an $SiN_x$ film. The Si substrate 201 is removed by etching a light transmission area from the rear surface of the Si substrate 201 after TFT is formed in a step to be described later.

The outline of fabrication process will be explained with reference to FIGS. 3 and 4.

Figure 3A:
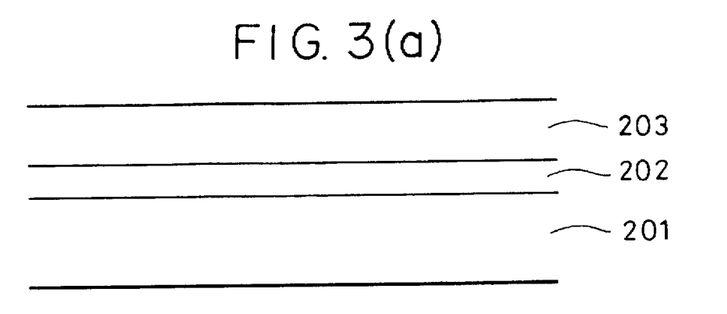
FIGS. 3(a) to 3(c) are schematic process charts of the liquid-crystal display device according to the second embodiment of the present invention.
Figure 3B:
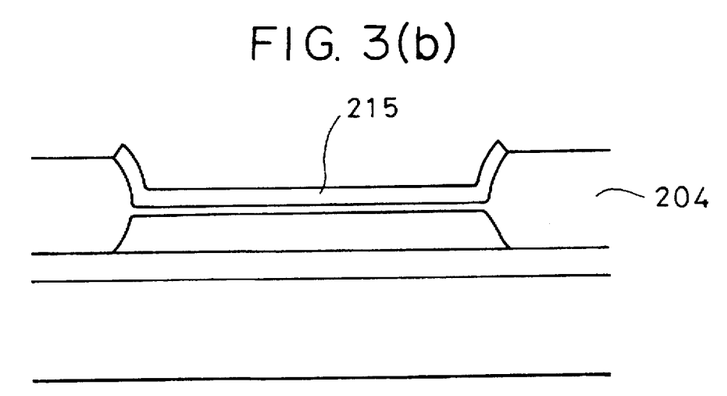

A silicon-on-insulator (SOI) substrate having an Si monocrystalline layer 203 formed on the Si substrate 201 shown in FIG. 3(a), with an insulating film 202 provided in between, is made to undergo localized oxidation of silicon (LOCOS), as shown in FIG. 3(b), so that the entire Si layer of an element separation area 204 is oxidized and made transparent.

Figure 3C:
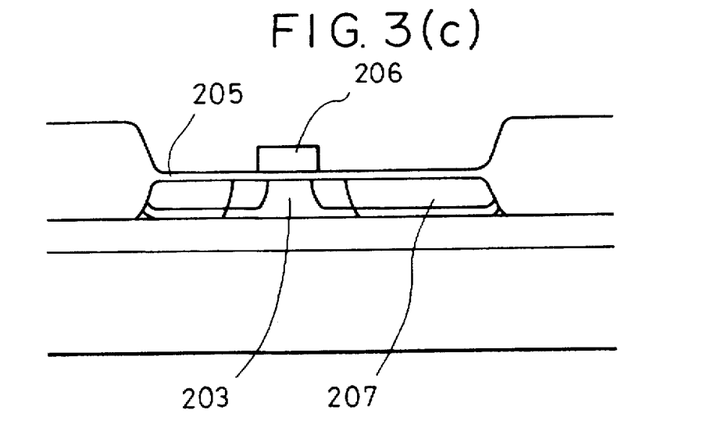

Next, as shown in FIG. 3(c), after the nitride film 215 is peeled off, a gate oxide film 205 is formed. Polycrystalline Si is formed as a gate electrode 206 and patterned. A source/drain area 207 is formed using the gate electrode 206 by ion implantation on the basis of self-alignment.

Figure 4A:
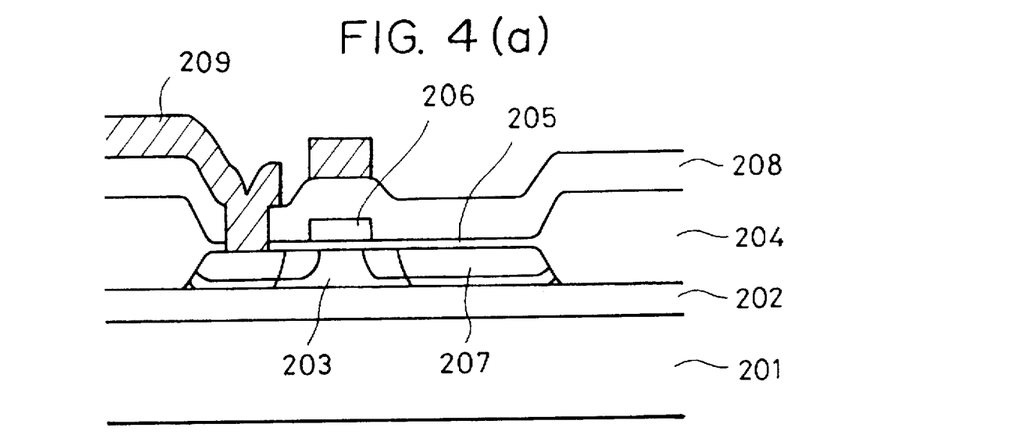
FIGS. 4(a) to 4(c) are schematic process charts of the liquid-crystal display device according to the second embodiment.
Figure 4B:
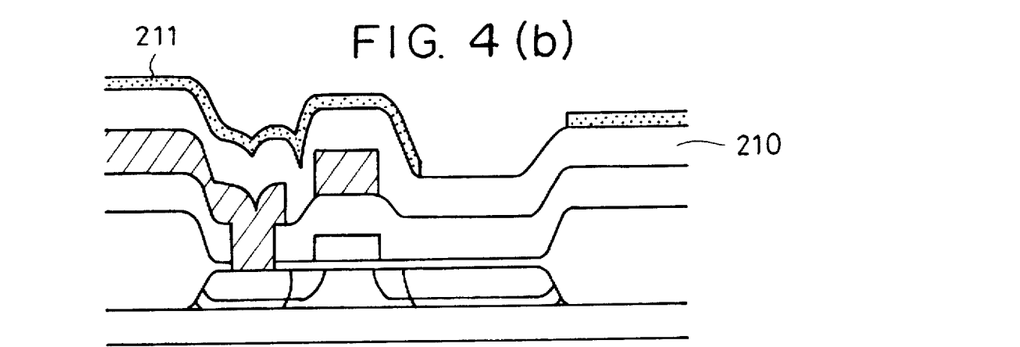
Figure 4C:
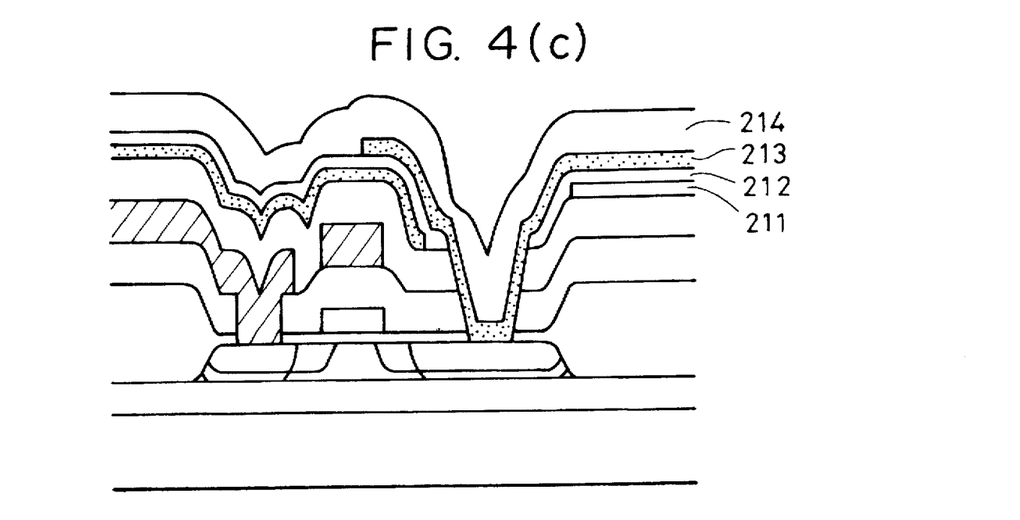

Then, as shown in FIG. 4(a), an interlayer insulating film 208 is formed, a window is provided in a predetermined portion, and metallic wiring 209 is performed. Next, as shown in FIG. 4(b), an $SiN_x$ film which serves as the first insulating film 210 is formed by use of plasma CVD. Finally, $SiN_x$ films which serve as the ITO films 211 and 213, the second insulating film 212, and the third insulating film 214 are in turn formed. Thus, the semiconductor device shown in FIG. 3(c) is obtained.

Since $SiN_x$ is used as storage capacitance in the second insulating film 212, $SiN_x$ having a dielectric constant greater than that of $SiO_2$ can be formed into a thick film, which is advantageous with respect to pinholes or the like. In addition, $SiN_x$ is advantageous over $SiO_2$ in terms of protection capability (resistance to humidity, resistance to ions or the like) in the third insulating film 214.

An SOI substrate is not limited to a specific substrate. A liquid-crystal element, a liquid-crystal driving circuit and other peripheral driving circuits can be formed on one substrate at the same time by using a substrate having a monocrystalline Si layer manufactured by the method described below. This is a preferable feature.

An explanation will now be given of that method. The monocrystalline Si layer of the semiconductor substrate is formed by using a porous Si base in which a monocrystalline Si base is made porous. An observation using a transmission type electron microscope shows that holes having an average diameter of approximately 600 Å are formed in the porous Si base. The monocrystallinity of the porous Si base is maintained in spite of the fact that the density of the porous Si is one-half or less than that of monocrystalline Si. It is possible to epitaxially grow a monocrystalline Si layer toward the upper portion of the porous layer. However, internal holes are rearranged above 1,000° C., and enhanced etching characteristics deteriorate. For this reason, the following low-temperature growth methods are considered preferable for the epitaxial growth of the Si layer: a monomolecular-beam epitaxial growth method, a plasma CVD method, a thermal CVD method, an optical CVD method, a bias sputtering method, and a liquid-crystal growth method.

An explanation will now be provided of a method of epitaxially growing a monocrystalline layer after P-type Si is made porous.

Initially, a Si monocrystalline base is prepared. This base is made porous by an anodization method using an HF solution. Even though the concentration of monocrystalline Si is 2.33 g/cm³, the concentration of the porous Si base can be changed from 0.6 to 1 g/cm³ by varying the concentration of the HF solution from 20 to 50 wt %.

This porous layer is readily formed into a porous Si base due to the reasons described below:

It was discovered that P-type Si can be made porous during an investigation on electrolytic polishing of semiconductors. In a Si dissolution reaction during anodization, positive holes are required in the Si anodization reaction within the HF solution. The reaction can be expressed as follows:

or where $e^+$ and $e^-$ represent positive holes and electrons, respectively, and n and λ each indicate the number of positive holes required to dissolve one atom of Si. When the condition $n>2$ or $\lambda>4$ is satisfied, porous Si is formed. It may be said from the above that P-type Si containing positive holes can easily be made porous.

It has, however, been reported that high-concentration N-type Si can also be made porous. Therefore, Si can be made porous irrespective of whether Si is of P-type or N-type.

Since a large amount of voids are formed within the porous layer, the density of the layer decreases by one half. As a result, since the surface area of the porous layer is markedly increased as compared with the volume thereof, its chemical etching speed is made considerably faster in comparison with an ordinary etching speed for a monocrystalline layer.

The conditions under which monocrystalline Si is made porous by anodization are listed below. A starting material for porous Si formed by anodization is not limited to monocrystalline Si, but Si of other crystalline structures may also be used.

Applied voltage: 2.6 V
Current density: 30 mA·cm⁻²
Anodization solution: $HF:H_2O:C_2H_5OH=1:1:1$
Time: 2.4 hours
Thickness of porous Si: 300 μm Porosity: 56%

A monocrystalline Si thin film is formed by epitaxially growing Si on the porous Si base formed in the above manner. The thickness of the monocrystalline Si thin film is preferably less than 50 µm and, more preferably, less than 20 µm.

Next, after the surface of the monocrystalline Si thin film is oxidized, a base which will eventually form a substrate is prepared and the oxidized film on the surface of the monocrystalline Si thin film is laminated on the base. Alternatively, after the surface of the newly prepared monocrystalline Si thin film is oxidized, the surface is laminated on the monocrystalline Si layer on the porous Si base. The reason for providing the oxidized film between the base and the monocrystalline Si layer is that when, for example, glass is used as a base, the characteristics of an electronic device can be enhanced considerably. This is because the interface level which depends on the substrate interface of a Si active layer, the level of the oxide film interface can be made lower than that of a glass interface. In addition, only a monocrystalline Si thin film in which porous Si gas is removed by selective etching which will be described later may be laminated on a new base. Although the film and the base are brought into complete contact by merely making them contact each other at room temperature after the respective surfaces thereof are cleaned to such an extent that the film and the base cannot be peeled off from each other easily by a van der Waals force, they are heat treated in a nitrogen atmosphere at a temperature of 200° to 900° C., more preferably 600° to 900° C., so that they are completely laminated to each other.

A $Si_3N_4$ layer is deposited as an etching preventing layer on the entire surface of each of two laminated bases, and then only the $Si_3N_4$ layer on the surface of the porous Si base is removed. Abietic acid wax may also be used instead of the $Si_3N_4$ layer. Thereafter, a semiconductor substrate having a thin-film monocrystalline Si layer can be obtained by removing the entire porous Si base by means of etching or the like.

An explanation will now be given of a selective etching method for electrolessly wet-etching only the porous Si base.

Preferred examples of etching solutions which have no etching effect on crystal Si and are capable of selectively etching only porous Si are: hydrofluoric acid, bufferred hydrofluoric acid, such as ammonium fluoride ($NH_4F$) or hydrogen fluoride (HF), a solution of hydrofluoric acid or bufferred hydrofluoric acid mixed with a hydrogen peroxide solution, a solution of hydrofluoric acid or bufferred hydrofluoric acid mixed with alcohol, or a solution of hydrofluoric acid or bufferred hydrofluoric acid mixed with a hydrogen peroxide solution and alcohol. Laminated substrates are soaked in these solutions for etching. The etching speed depends upon the concentration and temperature of the solution of hydrofluoric acid, bufferred hydrofluoric acid, and the hydrogen peroxide solution. The addition of the hydrogen peroxide solution permits the oxidation of Si to be faster than when such an addition is not made. Further, the reaction speed can be controlled by varying the ratio of the hydrogen peroxide solution. In addition, as a result of the addition of alcohol, the reaction produced air bubbles caused by the etching can be removed instantaneously from the etching surface without stirring. Thus, porous Si can be etched uniformly and efficiently.

Based on the weight of an etching solution, the HF concentration of bufferred hydrofluoric acid is preferably set at 1 to 95 wt %, more preferably at 1 to 85 wt %, and even more preferably at 1 to 70 wt %. Based on the weight of an etching solution, the $NH_4$ concentration of bufferred hydrofluoric acid is preferably set at 1 to 95 wt %, more preferably at 5 to 90 wt %, and even more preferably at 5 to 80 wt %.

Based on the weight of an etching solution, the HF concentration is preferably set at 1 to 95 wt %, more preferably at 5 to 90 wt %, and even more preferably at 5 to 80 wt %.

Based on the weight of an etching solution, the $H_2O_2$ concentration is preferably set at 1 to 95 wt %, more preferably at 5 to 90 wt %, and even more preferably at 10 to 80 wt %. That is, the concentration is set in a range in which the effect of the hydrogen peroxide solution can be exhibited.

Based on the weight of an etching solution, the alcohol concentration is preferably set at 80 wt % or less, more preferably at 60 wt % or less, and more preferably at 40 wt % or less. That is, the concentration is set in a range in which the effect of the alcohol can be exhibited.

The temperature is preferably set at 0° to 100° C., more preferably at 5° to 80° C., and even more preferably at 5° to 60° C.

Examples of alcohols which are usable in this process and from which the above-mentioned alcohol added effect can be expected include: isopropyl alcohol and ethyl alcohol.

A monocrystalline Si layer is formed on a large area of the entire area of the semiconductor substrate produced in the above manner in such a way that the layer is formed into a flat and uniform thin layer equivalent to an ordinary Si wafer.

Third Embodiment

Figure 5:
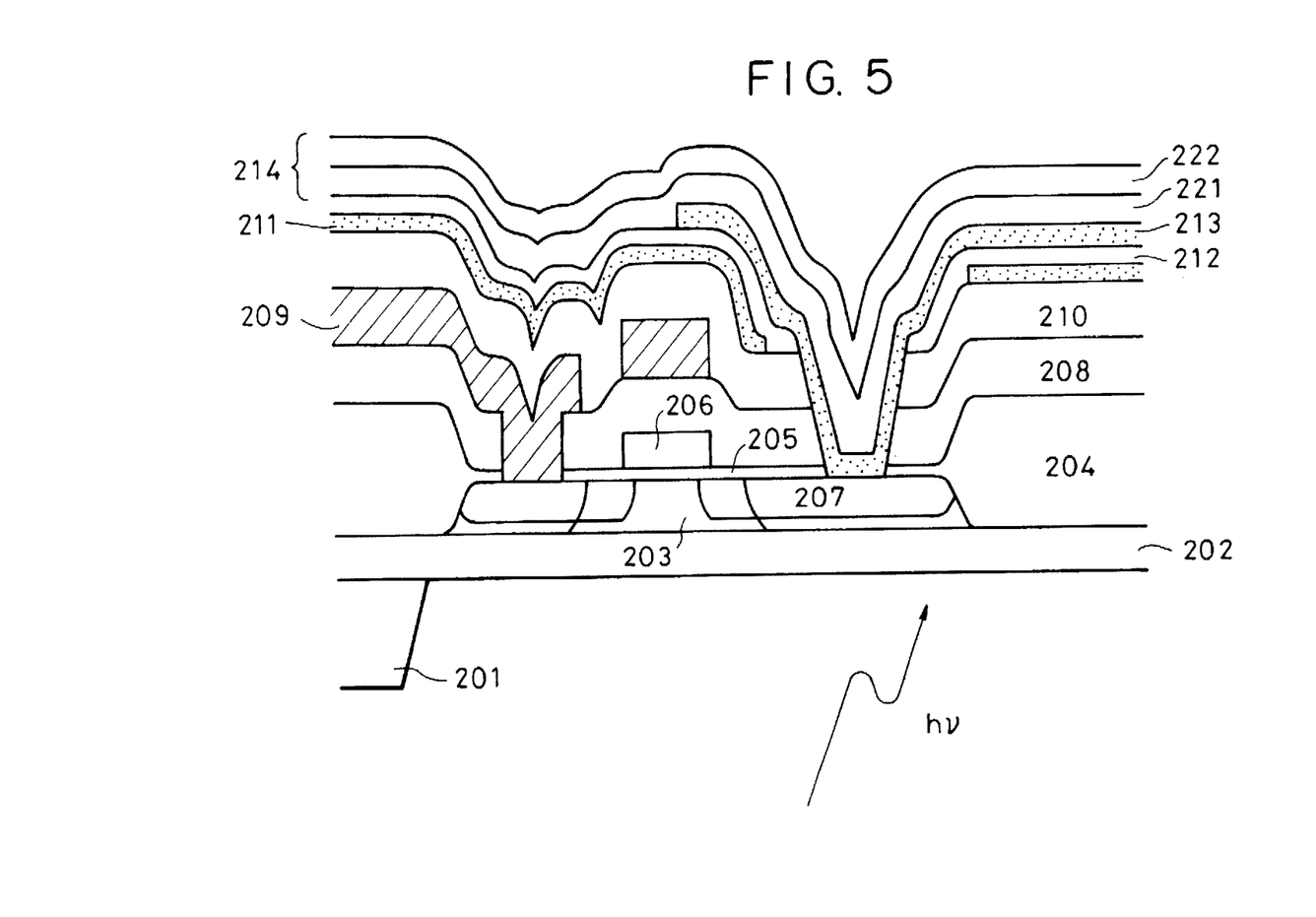
FIG. 5 is a sectional view of a liquid-crystal display device according to a third embodiment of the present invention.

As shown in FIG. 5, a liquid-crystal display device was manufactured in the same way as in the second embodiment except that the third insulating film 214 was formed into a stacked structure formed of an $SiN_x$ film 221 and an $SiO_2$ film 222.

According to this embodiment, since the insulating film is formed into a stacked structure, stress can be softened and pinholes can be prevented. Since the $SiN_x$ film 221 serves as an oxygen barrier, insulating films containing oxygen may also be used. Examples of materials for the films other than films with $SiN_x$ as the main constituent are: $SiO_2$, polyimide, $Ta_2O_5$, PSG (phospho-silicate glass) and AsSG (arsenic silicate glass). The same effect can also be obtained if the stacked structure is used in the second insulating film 212.

Fourth Embodiment

Figure 6:
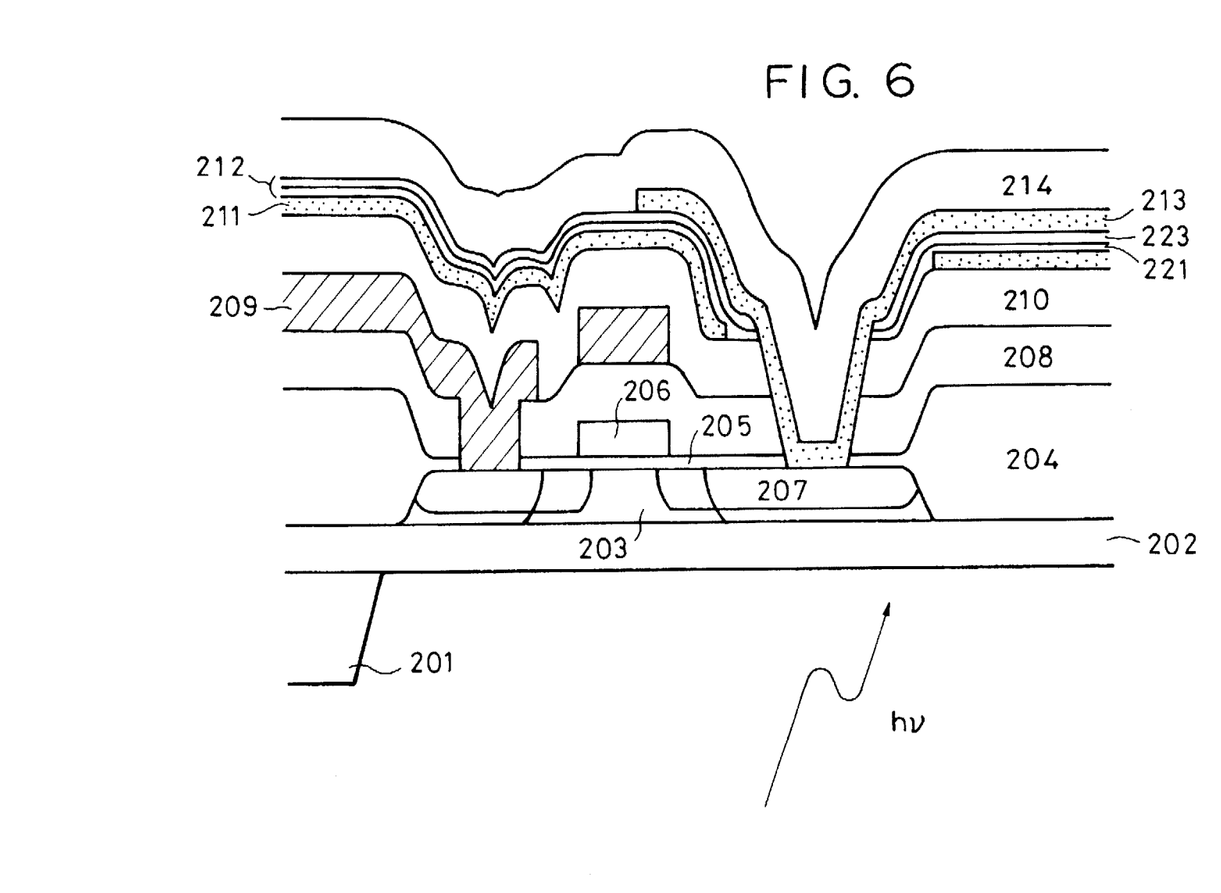
FIG. 6 is a sectional view of a liquid-crystal display device according to a fourth embodiment of the present invention.

As shown in FIG. 6, a liquid-crystal display device was manufactured in the same way as in the second embodiment except that the second insulating film 212 was formed into a stacked structure formed of the $SiN_x$ film 221 and a $Ta_2O_5$ film 223.

According to this embodiment, when the second insulating film 212 is used as storage capacitance, gradation is superior because the dielectric constant of the $Ta_2O_5$ film 223 is high. Examples having a dielectric constant equivalent to that of p-SiN, in addition to $Ta_2O_5$, are: $TiO_2$, $Al_2O_3$, $PbTiO_3$, PZT (composite oxide of Pb, Zr and Ti), and KTN (composite oxide of K, Ta and Nb).

Fifth Embodiment

Figure 7:
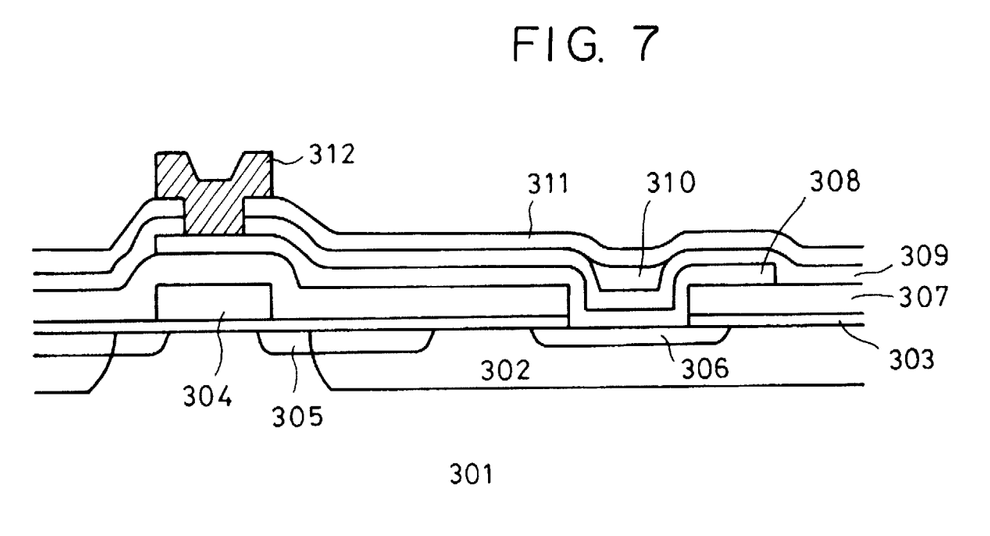
FIG. 7 is a sectional view of a photoelectric converting device according to a fifth embodiment of the present invention.
Figure 8:
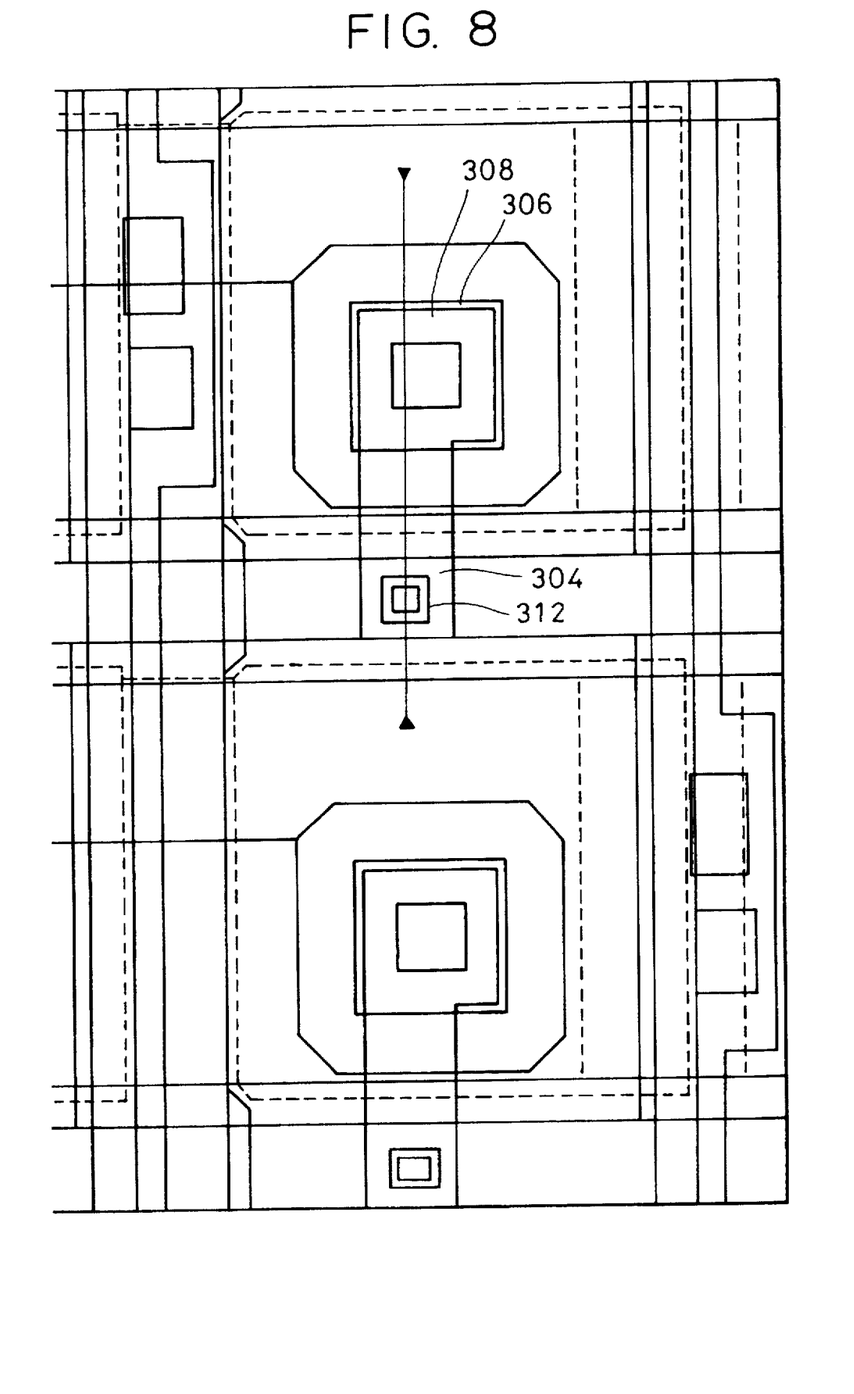
FIG. 8 is a plan view of the photoelectric converting device according to the fifth embodiment of the present invention.

FIG. 7 is a sectional view of a photoelectric converting device in which a semiconductor device of the present invention is used. FIG. 8 is a plan view thereof. This is an example of an application into a bipolar type photoelectric converting device having a control electrode provided on a base. A considerable decrease in an opening ratio is caused by an emitter output electrode. The opening ratio can be increased by 10% by replacing the electrode with ITO.

The structure of a film will be explained below with reference to FIG. 7.

Reference numeral 301 denotes a collector area (N⁺); reference numeral 302 denotes a base area (P⁻); reference numeral 303 denotes a gate oxide film; reference numeral 304 denotes a base control electrode; reference numeral 305 denotes a base area (N⁺); reference numeral 306 denotes an emitter area (N⁺); and reference numeral 312 denotes metallic wiring. An emitter electrode 308 is formed of ITO. Reference numerals 307, 309 to 311 denote a first to a fourth insulating film, respectively. The first and second insulating films 307 and 309 are formed of $SiN_x$ films. A third and a fourth insulating film 310 and 311 are not necessarily formed of $SiN_x$ films because the films 310 and 311 are not directly in contact with the emitter electrode (ITO) 308, and no problem is posed even if $SiO_2$ type insulating films may be used.

According to the present invention, as described above, since an insulating film with oxygen as the main constituent is not brought into contact with ITO, a high-speed semiconductor device whose characteristics, such as the resistance value of ITO, do not change and which consumes a small amount of power can be obtained. As a result, a liquid-crystal display device having high image quality and a photoelectric converting device can be obtained by using the semiconductor device.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the claims. The following claims are to be accorded the broadest interpretation, so as to encompass all such modifications and equivalent structures and functions.

What is claimed is:

1. A semiconductor device comprising a first insulating film 300 Å to 2 μm in thickness consisting essentially of silicon nitride in contact with a first surface of an indium-tin-oxide film; a second insulating film on a second surface of said indium-tin-oxide film opposite to that of said first insulating film, where said first insulating film is in contact with a silicon oxide thin film parallel to said first insulating film.

2. A semiconductor device according to claim 1, wherein said second film having a dielectric constant equal to or greater than that of silicon nitride is disposed on at least a portion of said first insulating film.

3. A semiconductor device according to claim 2, wherein the film having a dielectric constant equal to or greater than that of silicon nitride is selected from a group of oxides consisting of $Ta_2O_5$, $TiO_2$, $Al_2O_3$, $PbTiO_3$, PZT (composite oxide of Pb, Zr and Ti), and KTN (composite oxide of K, Ta and Nb).

4. A semiconductor device according to claim 1, wherein said second insulating film consists essentially of silicon nitride.

5. A semiconductor device comprising an indium-tin-oxide film, wherein a surface of said indium-tin-oxide film is in contact with a surface of a silicon nitride film 300 Å to 2 μm in thickness, and another surface of said silicon nitride film is in contact with a silicon oxide film parallel to said silicon nitride film.

6. A semiconductor device according to claim 5, wherein an insulating film is disposed on another surface of said indium-tin-oxide film.

7. A semiconductor device according to claim 6, wherein said insulating film comprises silicon nitride.

8. A semiconductor device according to claim 6, wherein said insulating film is selected from $SiO_2$, polyimide, $TaO_2$, phospho-silicate glass or arsenic silicate glass.

9. A liquid-crystal display device according to the semiconductor device of claim 5.

10. A photoelectric converting device according to the semiconductor device of claim 5.

* * * * *